United States Patent
McCullough et al.

(10) Patent No.: US 6,822,728 B2
(45) Date of Patent: Nov. 23, 2004

(54) ILLUMINATION SYSTEM WITH SPATIALLY CONTROLLABLE PARTIAL COHERENCE COMPENSATION FOR LINE WIDTH VARIANCES IN A PHOTOLITHOGRAPHIC SYSTEM

(75) Inventors: Andrew W. McCullough, Newtown, CT (US); Gregg M. Gallatin, Newtown, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/667,387

(22) Filed: Sep. 23, 2003

(65) Prior Publication Data

US 2004/0057033 A1 Mar. 25, 2004

Related U.S. Application Data

(63) Continuation of application No. 09/599,383, filed on Jun. 22, 2000, now Pat. No. 6,628,370, which is a continuation-in-part of application No. 08/799,107, filed on Feb. 11, 1997, now Pat. No. 6,259,513.
(60) Provisional application No. 60/031,725, filed on Nov. 25, 1996.

(51) Int. Cl.$^7$ .......................... G03B 27/42; G03B 27/54
(52) U.S. Cl. ........................................ 355/53; 355/67
(58) Field of Search .............................. 355/71, 55, 53, 355/67

(56) References Cited

U.S. PATENT DOCUMENTS

| | | |
|---|---|---|
| 4,621,922 A | 11/1986 | Tabarelli et al. |
| 5,184,176 A | 2/1993 | Unno et al. |
| 5,296,892 A | 3/1994 | Mori |
| 5,329,336 A | 7/1994 | Hirano et al. |

(List continued on next page.)

FOREIGN PATENT DOCUMENTS

| | | | |
|---|---|---|---|
| EP | 0 486 316 A2 | 5/1992 | ............. G03F/7/20 |
| EP | 0 564 264 A1 | 10/1993 | ............. G03F/7/20 |
| JP | 07-094399 | 4/1995 | |
| JP | 07-201723 | 8/1995 | ......... H01L/21/027 |

OTHER PUBLICATIONS

English–language Abstract of JP 07–094399, published Apr. 7, 1995, from http://www.19.ipdl.jpo.go.jp/PA1/result/detail/main/wAAAFzaOGtDA407094399P1.htm, 2 Pages (last visited Sep. 9, 2003).

English–language Abstract of JP 07–201723, published Aug. 4, 1995, from http://www.19.ipdl.jpo.go.jp/PA1/result/detail/main/wAAAxtailuDA407201823P1.htm, 2 Pages (last visited Sep. 9, 2003).

Primary Examiner—Alan Mathews
(74) Attorney, Agent, or Firm—Sterne, Kessler, Goldstein & Fox P.L.L.C

(57) ABSTRACT

An illumination system used in photolithography for the manufacture of semiconductors having an array optical element with different illumination regions corresponding or matched to different line width variations printed on a photosensitive substrate. The array optical element may be a filter, diffractive optical element, or micro lens array having illumination regions producing different types of illumination properties or characteristics. Each of the illumination regions are matched or correspond to a respective region on the reticle to provide optimized exposure of a photosensitive resist covered wafer. The optical element of the present invention may be used to tailor a conventional illumination system to the unique characteristics of the projection optics used in the photolithographic system, thereby compensating for vertical and horizontal bias or variations in line width for features oriented in the vertical and horizontal direction. This facilitates the manufacture of semiconductor devices with small feature sizes while improving qualify and increasing yield.

31 Claims, 12 Drawing Sheets

U.S. PATENT DOCUMENTS

| | | | |
|---|---|---|---|
| 5,357,312 A | 10/1994 | Tounai | |
| 5,383,000 A | 1/1995 | Michaloski et al. | |
| 5,446,587 A | 8/1995 | Kang et al. | |
| 5,631,721 A | 5/1997 | Stanton et al. | |
| 5,642,183 A | 6/1997 | Sugihara et al. | |
| 5,673,103 A | 9/1997 | Inoue et al. | |
| 5,684,566 A | 11/1997 | Stanton | |
| 5,714,218 A | * 2/1998 | Nishio et al. | 428/64.1 |
| 5,864,381 A | * 1/1999 | Neal et al. | 351/205 |
| 6,049,374 A | 4/2000 | Komatsuda et al. | |
| 6,078,380 A | 6/2000 | Taniguchi et al. | |
| 6,259,513 B1 | 7/2001 | Gallatin et al. | |

* cited by examiner

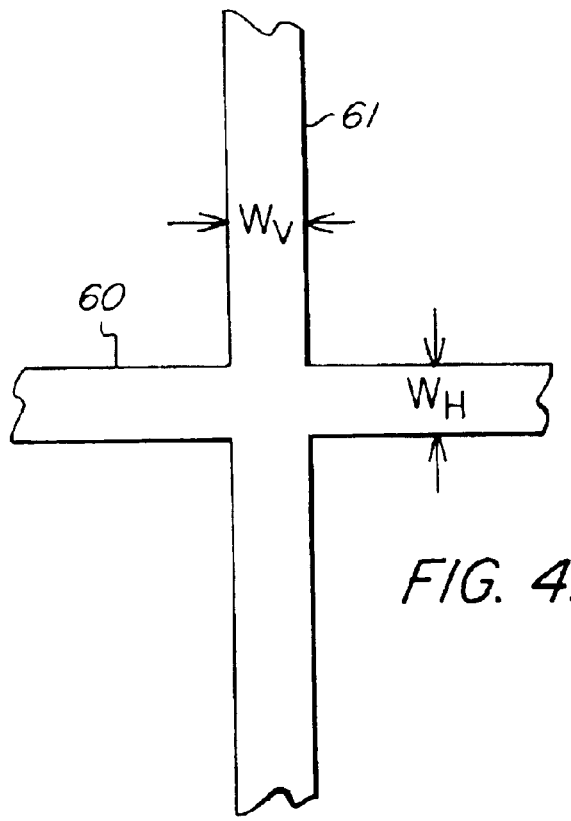
FIG. 4A
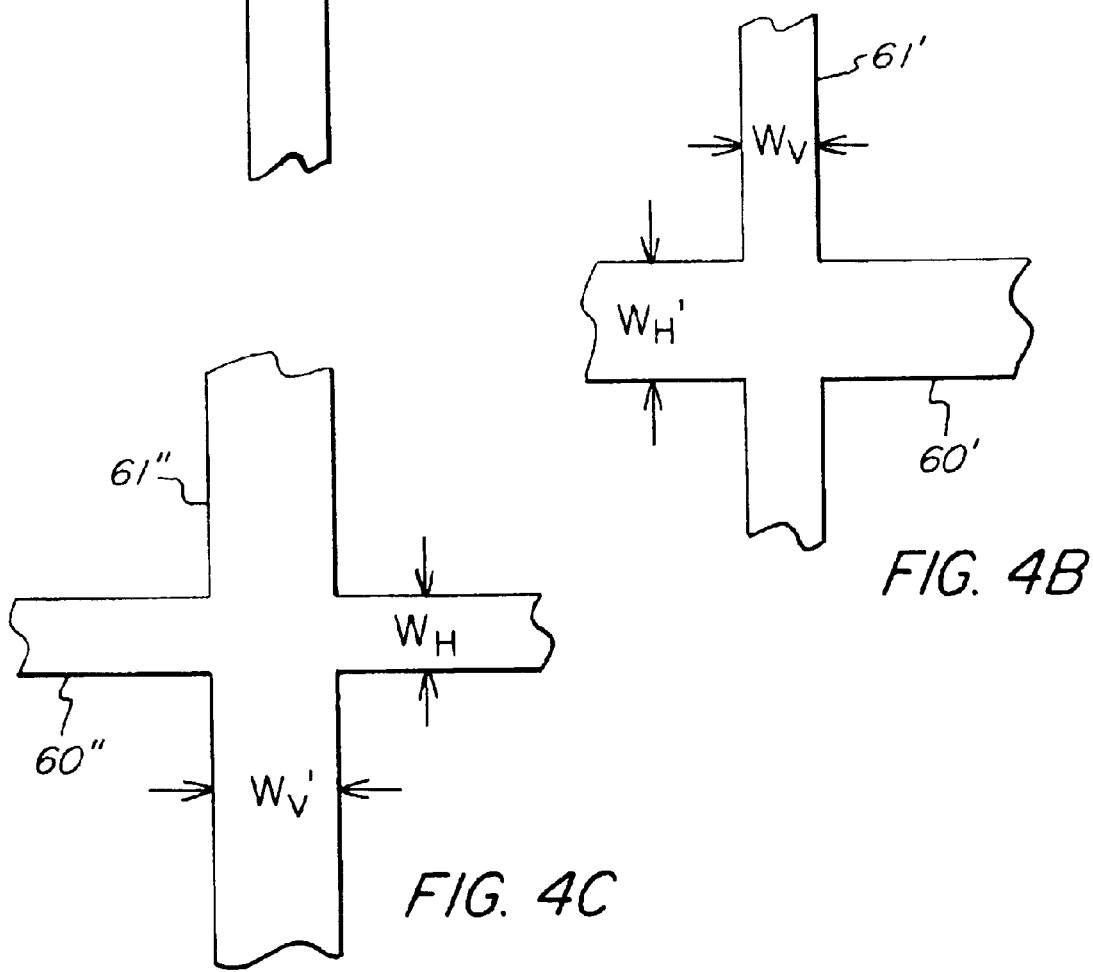
FIG. 4B
FIG. 4C

ILLUMINATION SYSTEM WITH SPATIALLY CONTROLLABLE PARTIAL COHERENCE COMPENSATION FOR LINE WIDTH VARIANCES IN A PHOTOLITHOGRAPHIC SYSTEM

CROSS-REFERENCE TO RELATED APPLICATIONS

This application is a continuation of U.S. Ser. No. 09/599,383, filed Jun. 22, 2000 (now U.S. Pat. No. 6,628,370), which is a continuation-in-part of U.S. Ser. No. 08/799,107, filed Feb. 11, 1997, now U.S. Pat. No. 6,259,513, which claims the benefit of U.S. Prov. No. 60/031,725, filed Nov. 25, 1996, which are all incorporated by reference herein in their entireties.

FIELD OF THE INVENTION

The present invention relates generally to semiconductor manufacturing, and more particularly to an illumination system that is locally spatially controllable to reduce line width variations in a photolithographic system.

BACKGROUND OF THE INVENTION

Photolithography is often used in the manufacture of semiconductors. The image of a reticle having a circuit pattern thereon is projected onto a photosensitive substrate such as a wafer. The wafer is subsequently processed, forming printed patterns thereon. This process is generally repeated several times, forming multiple layers. As the art develops and the element sizes of the semiconductor devices become smaller, there is a need for improved illumination sources used in the lithographic printing systems. Accordingly, there have been many types of illumination systems disclosed which may enhance the quality of imaging of a reticle onto a photosensitive substrate. One such illumination system is disclosed in U.S. Pat. No. 5,296,892 entitled "Illuminating Apparatus and Projection Exposure Apparatus Provided With Such Illumination Apparatus" issuing to Mori on Mar. 22, 1994, which is herein incorporated by reference. Therein disclosed is an illumination system having an optical integrator or fly's eye lens positioned next to a condenser. The optical integrator or fly's eye lens is designed to be replaceable so that the numerical aperture of the illumination system can be varied. Another illumination system is disclosed in U.S. Pat. No. 5,357,312 entitled "Illuminating System In Exposure Apparatus For Photolithography" issuing to Tounai on Oct. 18, 1994, which is herein incorporated by reference. Therein disclosed is an illumination system that desirably shapes a uniform light beam rather than by blockage with an aperture diaphragm thus reducing loss of illuminating light. Additionally, the cross sectional intensity profile of the light beam in the source aperture can be rendered annular. Yet another illumination system is disclosed in U.S. Pat. No. 5,329,336 entitled "Exposure Method and Apparatus" issuing to Hirano et al on Jul. 12, 1994. Therein disclosed is an exposure apparatus having a detector that is compensated for due to coherence changes in the exposure apparatus. Additionally, the concept of zone and modified light source illumination is disclosed for the purpose of optimizing the image of a reticle pattern. Accordingly, there is a need to provide different illumination characteristics to reduce variations of line width due to the photolithographic system or tool. However, due to the complexity of illumination sources and the difficulty of modifying them for a particular optical system to compensate for variations of the photolithographic system, and in particular the projection optics, often the image is not optimized. As a result, some portions of the field may be illuminated adequately while others are not. This may result in different imaging results on different portions of a wafer. Additionally, the projection optics may not provide an image of a reticle onto a photosensitive substrate that when processed has line widths that are within a predetermined tolerance. Therefore, there is a need for an illumination system that compensates for the projection optics variation to optimize the exposure of a photosensitive substrate.

SUMMARY OF THE INVENTION

The present invention relates to the use of an optical element which may be a microlens array or diffractive element that is divided into a plurality of different spatial regions, providing different illumination characteristics or properties for each local region. The optical element with its plurality of different regions is matched to different regions of line width variance due to different optical performance at the local area in question that result from variances in the photolithographic system or tool, and in particular the projection optics. The location of the different illumination characteristics are selected to optimize or provide improved imaging at different locations in the image field. Each of the plurality of different illumination regions on the optical element is matched to each of the plurality of different locations in the image field to locally modify the illumination of a reticle resulting in an overall improvement of the image of the reticle on a processed photosensitive substrate. The present invention is particularly applicable to a scanning photolithographic system.

It is an object of the present invention to optimize the performance of a photolithographic system, and in particular to reduce line width variations.

It is another object of the present invention to compensate for certain imperfections in the optics of a photolithographic tool that affect line width.

It is a further object of the present invention to be able to adjust the image line width selectively in the horizontal or vertical axis at different locations in a printed field.

It is an advantage of the present invention that the illumination system can easily be changed to improve imaging or adapt to changes in the projection optics.

It is a feature of the present invention that different illumination regions of an optical element are used to locally modify illumination of a reticle and improve performance of the photolithographic tool or system.

It is another feature of the present invention that the different illumination regions modify the emerging cone of radiation or illumination used to project the image of a reticle onto a photosensitive substrate.

It is another feature of the present invention that partial coherence or fill geometry is locally or spatially modified in an illumination field.

These and other objects, advantages, and features will become readily apparent in view of the following detailed description.

BRIEF DESCRIPTION OF THE DRAWINGS

FIG. 4A is a plan view illustrating an orthogonal line pattern.

FIG. 4B is a plan view illustrating a printed line pattern with horizontal bias.

FIG. 4C is a plan view illustrating a printed line pattern with vertical bias.

DETAILED DESCRIPTION OF THE PREFERRED EMBODIMENTS

Figure 1:
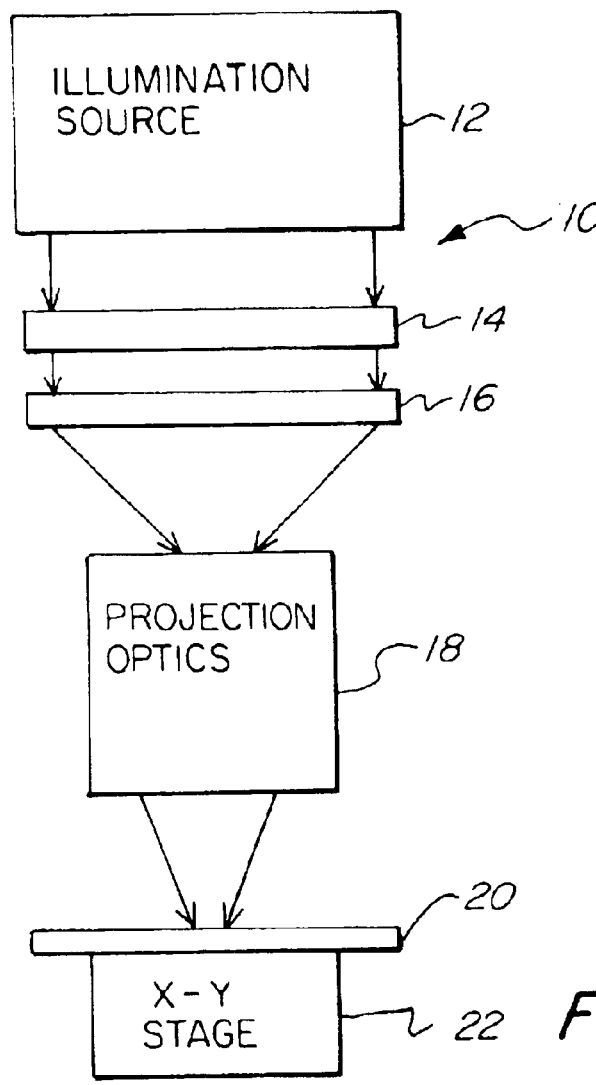
FIG. 1 is a schematic of a photolithographic system.

FIG. 1 schematically illustrates a photolithographic system 10. Illumination source 12 projects electromagnetic radiation through an optical element 14 and onto a reticle 16. An illumination plane is formed at the reticle 16. An image of the reticle 16 is projected onto a wafer 20 by projection optics 18. Wafer 20 has a photosensitive resist coating thereon which is exposed by the image of the reticle 16. Wafer 20 is mounted on a wafer stage 22 which is movable in the X and Y direction. In some photolithography operations, the wafer stage 22 may also be scanned along one axis. The illumination source 12 may be any illumination source or system, such as that disclosed in U.S. patent application Ser. No. 08/449,301 filed May 24, 1995 and entitled "Hybrid Illumination System For Use In Photolithography" by Stanton et al and issued on May 20, 1997 as U.S. Pat. No. 5,631,721, which is herein incorporated by reference in its entirety.

Figure 2:
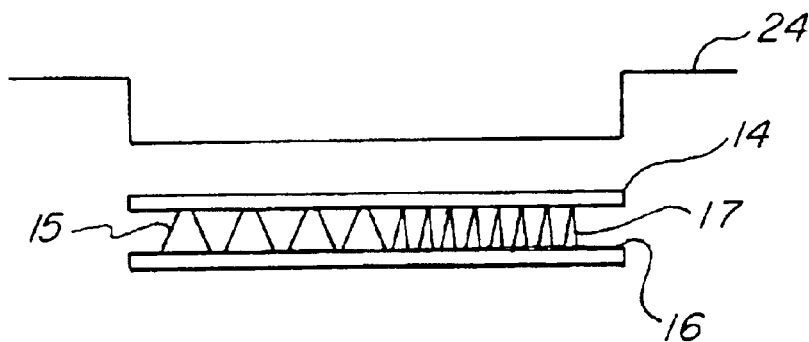
FIG. 2 is a schematic illustrating an embodiment of the present invention.

FIG. 2 illustrates an illumination profile 24 created by the illumination source 12, illustrated in FIG. 1. Generally, it is desirable that the intensity profile 24 is relatively uniform so that the exposure level is constant at the wafer or photosensitive substrate. However, the intensity profile 24 need not be uniform. This relatively uniform illumination intensity profile 24 is projected through the optical element 14. The optical element 14 then creates an illumination field or plane at or adjacent to the reticle 16. The illumination plane formed at reticle 16 projects the image of the reticle 16 onto a photosensitive resist covered substrate or wafer 20, illustrated in FIG. 1. Electromagnetic radiation represented by lines 15 illustrate the different illumination properties, such as numerical aperture, fill geometry, partial coherence or fill geometry, and others, provided over a region of the reticle by the optical element 14. Electromagnetic radiation represented by lines 17 illustrate other, different illumination properties than those represented by lines 15. While only several different illumination properties are illustrated, clearly there can be many different illumination properties spatially distributed over the reticle 16 by the optical element 14.

Figure 3A:
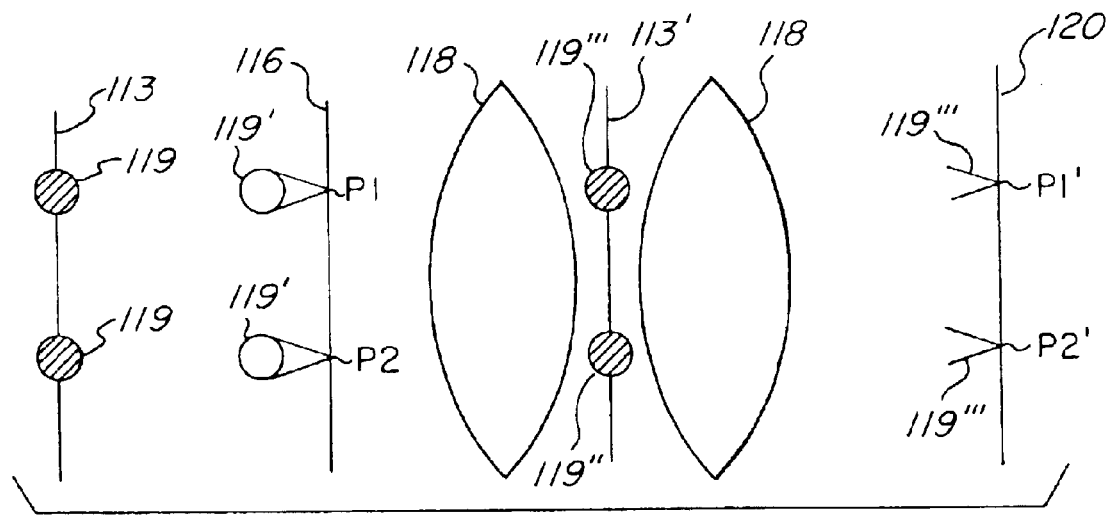
FIG. 3A is a schematic illustrating illumination of a reticle with a single spatially uniform partial coherence or fill geometry.
Figure 3B:
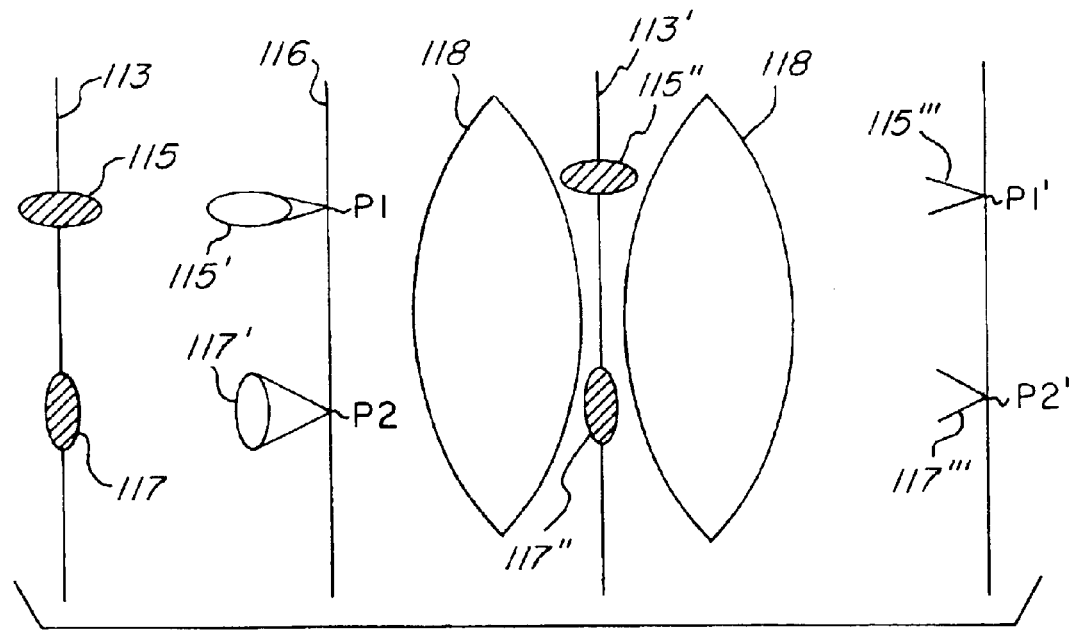
FIG. 3B is a schematic illustrating illumination of a reticle with local modification of partial coherence or fill geometry.

FIGS. 3A and 3B schematically illustrate the operation of the present invention. FIG. 3A illustrates illumination of a reticle 116, positioned at the object or reticle plane, with substantially uniform partial coherence or fill geometry at two spatially different points P1 and P2 on the reticle 116. The projection optics are represented by lenses 118 and form pupil planes 113 and 113'. The circles 119 represent illumination having a spatial distribution that is formed at pupil plane 113. The two circles 119 represent illumination with substantially the same illumination properties, including partial coherence or fill geometry. The illumination forms a cone of rays 119' at the two different spatially separated points P1 and P2 on the reticle 116. The cone of rays 119' are characteristic of the partial coherence or fill geometry of the illumination system. Circles 119" represent the spatial distribution of the electromagnetic radiation from the illumination system formed at the pupil plane 113' of the projection optics represented by lenses 118. Cone of rays 119''' represent the angular distribution of the electromagnetic radiation used to expose a photosensitive substrate 120, positioned at the image or wafer plane, at two points P1' and P2' corresponding or conjugated with points P1 and P2 on the reticle 116. The partial coherence or fill geometry of the illumination is substantially the same at points P1' and P2'. This would be generally acceptable if the projection optics performed uniformly. However, the projection optics may at times introduce a bias to line widths at different spatial locations and orientations. For example, at different spatial locations in a field the projection optics may introduce a horizontal or vertical bias changing the horizontal or vertical line width on a photosensitive substrate at different spatial locations.

FIG. 3B illustrates illumination of a reticle 116, positioned at the object or reticle plane, with different partial coherence or fill geometry at two spatially separate or different points P1 and P2 on the reticle 116. The projection optics are represented by lenses 118 and form pupil planes 113 and 113'. The oval 115 represent illumination having a first spatial distribution that is formed at pupil plane 113. The oval 117 represents illumination having a second spatial distribution that is formed at pupil plane 113. The two ovals 115 and 117 represent illumination with different illumination properties, specifically partial coherence or fill geometry. The illumination forms a cone of rays 115' and 117, at the two different spatially separated points P1 and P2 on the reticle 116. The cone of rays 115" and 117" are characteristic of the partial coherence or fill geometry of the illumination system. Ovals 115'" and 117'" represent the spatial distribution of the electromagnetic radiation from the illumination system formed at the pupil plane 113' of the projection optics represented by lenses 118. Cone of rays 115'" and 117'" represent the angular distribution of the electromagnetic radiation used to expose a photosensitive substrate 120, positioned at the image or wafer plane, at two points P1' and P2' corresponding or conjugated with points P1 and P2 on the reticle 116. The partial coherence or fill geometry of the illumination is different at points P1' and P2'.

The optical element 14, illustrated in FIGS. 1 and 2 is used to modify the electromagnetic radiation from the illumination system to spatially vary the partial coherence or fill geometry at different local regions in the illumination field. FIGS. 3A and 3B illustrate the operation of the present invention. Each point in the reticle is illuminated by a cone of rays from the illumination system. The cone is characteristic of the partial coherence or fill geometry of the illumination system and can in general have a complex angular distribution. This angular distribution is mapped into a spatial distribution at the pupil plane of the lens, and at the illuminator. It is sharply focused at the reticle modified by the magnification and numerical aperture of the projection optic system. As an illustration, points P1 and P2 on the reticle correspond or match points P1' and P2' on the wafer or photosensitive substrate. Due to imperfections in the projection optics, the line width printed at P1' and P2' may differ, in particular a difference between line width for horizontally oriented lines and vertically oriented lines. FIG. 3A illustrates this description and shows a general horizontal/vertical bias of y at P1' and x at P2', which may be negative. This horizontal/vertical bias can be compensated for by adjustment of the partial coherence or fill geometry, the angular distribution of light in the illumination cone, because the horizontal/vertical bias will in general be changeable by changing the partial coherence or fill geometry. This is illustrated in FIG. 3B.

The change in illumination improves system performance by correcting for any signature in the projection optics. It is clear to one skilled in the art that this can be done for any reasonable number of separate zones. It is also clear to one skilled in the art that this is a procedure that can apply to any distribution of light illuminating the zones of the reticle including, but not limited to annular, quadrupole, or other illumination distributions or types.

This method can be thought of as micro tuning the illumination cone as a function of the position of the reticle field so as to optimize the system response in lithographic printing. This tuning can be done in any base line illumination system, again such as quadrupole, annular and so on. This compensation is machine specific.

Due to the very high resolution and small line widths required in the manufacture of semiconductors, often variations in line width are detected on processed substrates. Variations in line widths between horizontal and vertical line widths may be due to various factors and have been referred to as horizontal/vertical bias. Accordingly, for a specific photolithographic system or tool, a horizontal/vertical bias map with position may be established that maps out the various line width variations that occur for a specific photolithographic tool. This applies to any orthogonal set of lines such as plus and minus forty-five degree lines as well as horizontal and vertical lines. This is often referred to as the system or tool signature. By utilizing test reticles, the areas or regions of variations in line width over an image field can readily be mapped or located. Other inventions relating to line width control are disclosed in U.S. patent application Ser. No. 09/023,407 filed by McCullough et al on Feb. 12, 1998 and entitled "Adjustable Slit and Method for Varying Line Width", and U.S. patent application Ser. No. 09/232,756 filed by McCullough on Jan. 15, 1999 and entitled "Dose Correction for Along Scan Linewidth Variation", both of which are herein incorporated by reference in their entireties.

FIGS. 4A–C illustrate horizontal/vertical bias. FIG. 4A illustrates a horizontal line 60 having a width of $W_H$ and a vertical line 61 having a width of $W_V$. Width $W_H$ is substantially equal to width $W_V$. FIG. 4B illustrates printing of the line pattern illustrated in FIG. 4A with a projection optic system having horizontal bias at a particular location in the field. Due to the horizontal bias, horizontal line 60' has a changed printed line width $W_H{}'$ whiled the vertical line 61' has substantially the same line width $W_V$, as illustrated in the line pattern in FIG. 4A. Analogously, FIG. 4C illustrates printing of the line pattern illustrated in FIG. 4A with a projection optic system having vertical bias at a particular location in the field. Due to the vertical bias, vertical line 61" has a changed printed line width $W_V{}'$, while the horizontal line 60" has substantially the same line width $W_H$, as illustrated in the line pattern in FIG. 4A. A projection optical system may have a positive, wider line width, or negative, narrower line width, bias or a combination of both horizontal and vertical bias at a single location.

Generally, the horizontal and vertical bias will vary spatially within the field of the projection optic system and be different for each projection optic system. This is often referred to as the signature of the projection optic system. The signature of the particular projection optic system can be determined and an optical element fabricated modifying the partial coherence or fill geometry of the illumination compensating for the horizontal and vertical bias at different locations where required to more accurately print an image of the reticle.

The present invention provides improved imaging performance of the photolithographic tool and permits coherence and other illumination properties to be modified as a function of spatial position in the illumination field or plane and optimized based on putting in the needed perturbation to correct for the projection optic deficiency. Illumination properties such as partial coherence may be varied spatially at different points to compensate for any deviation from desired performance of the illumination field or plane. For example, illumination properties may be varied along one axis to compensate for certain imperfections in projection optics in a scanning type photolithographic tool where a rectangular illumination field is scanned across the reticle. This may be particularly advantageous in that illumination properties may be varied in a longitudinal direction of the rectangular slit being scanned, thereby compensating for any imperfections that may exist in the projection optics. Different illumination regions may be used to compensate for imperfections in other optical elements, such as the projection optics, to improve exposure of a photosensitive resist covered wafer or substrate.

Figure 5:
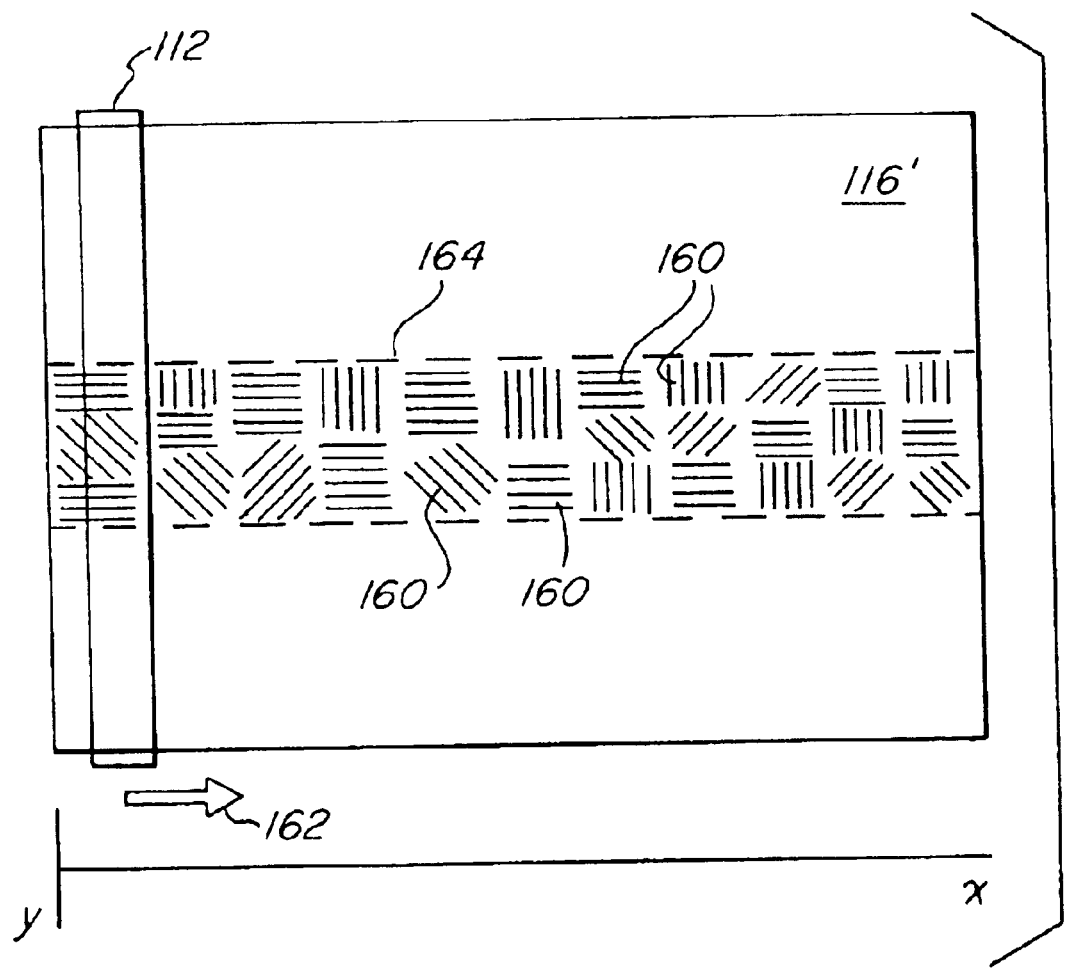
FIG. 5 is a plan view illustrating illumination of a reticle with a scanning illumination field.

FIG. 5 illustrates the illumination of a reticle or mask with a scanning illumination field for projection onto a photosensitive substrate. A reticle 1161 is comprised of a plurality of spaced lines 160, each having a line width. The lines 160 may be of any orientation but are often perpendicular with respect to each other in a horizontal and vertical direction or orientation. Generally, the lines represent circuit patterns to be reproduced for forming semiconductor devices. Only the central strip 164 is illustrated for convenience. However, the lines 160 generally cover the entire reticle 1161. A narrow rectangular slit illumination field 112 is used to scan in the direction of arrow 162 the entire length of the reticle 116. As a result, the image of the entire reticle 1161 or portion thereof is reproduced on a photosensitive substrate.

Figure 6:
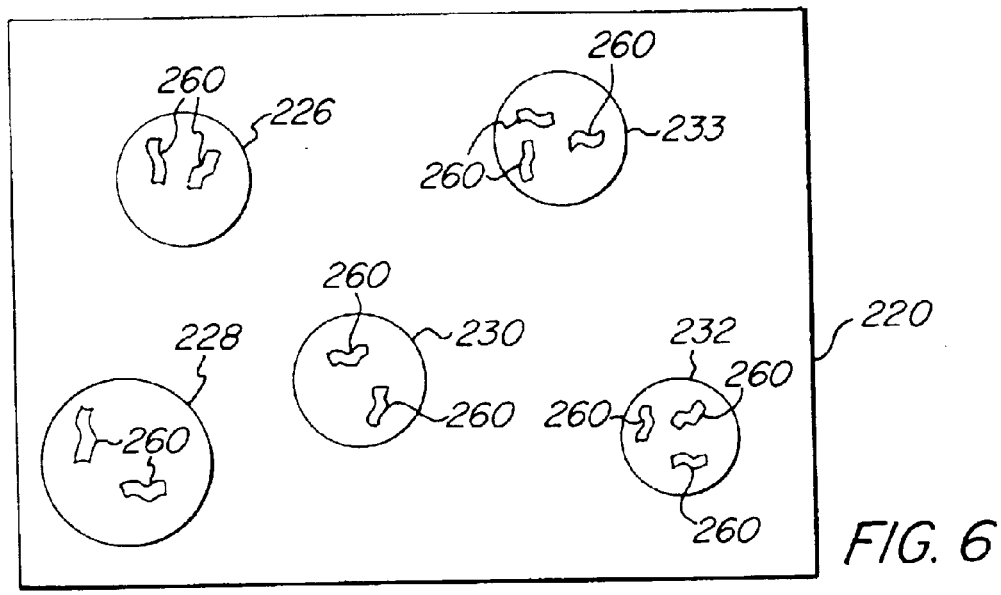
FIG. 6 is a plan view illustrating a processed photosensitive substrate having a plurality of regions of line widths and orientation.

FIG. 6 illustrates a processed photosensitive substrate 220 having a plurality of line widths 260 thereon. The line width variations may affect horizontal lines or vertical lines in different regions or sections. Accordingly, the various regions 226, 228, 230, 232, and 233 have identifiable locations on the substrate 220. The locations, as well as the degree of line width variance or horizontal/vertical bias, are readily determined by processing only a few test substrates. These variations or horizontal/vertical bias may be easily mapped and identified so that their spatial locations are known. Once these line width variation regions or sections 226, 228, 230, 232, 233 are identified and quantified, the teachings of the present invention may be utilized to reduce line width variations caused by horizontal/vertical bias and improve image performance.

Figures 7A, 7B:
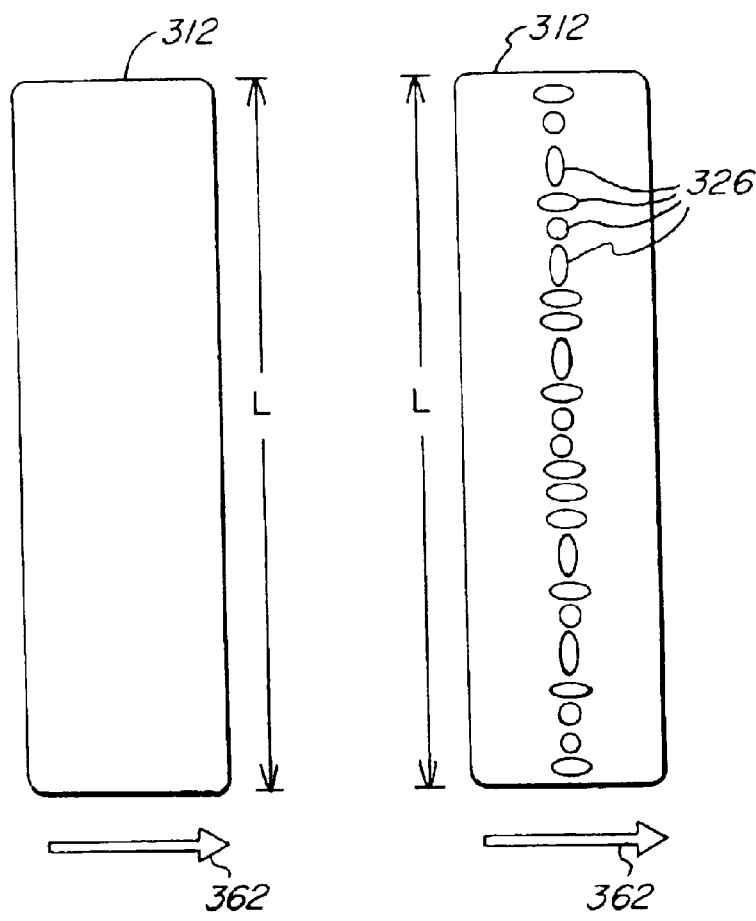
FIGS. 7A and 7B is a plan view schematically illustrating different regions having different zones of different partial coherence or fill geometry in a scanning illumination field.

The present invention is particularly applicable to a scanning photolithographic system. FIGS. 7A and 7B schematically illustrates a slit illumination field created using an optical element having different regions or zones at different locations providing different partial coherence or fill geometry or cones of illumination affecting horizontal/vertical bias to improve printing of the image of a reticle. FIG. 7A represents a slit illumination field 312 having a longitudinal dimension L and that is scanned over a photosensitive substrate in the direction of arrow 362. FIG. 79 schematically illustrates changes in partial coherence or fill geometry or the cone of illumination, represented by ovals 326, in the longitudinal dimension L of the slit illumination field 312. The changes in partial coherence or fill geometry correspond or match locations on a photosensitive substrate having horizontal/vertical bias caused by the signature of a particular projection optics. Accordingly, the partial coherence or fill geometry is not uniform over the entire illumination field, but is controlled over portions or zones of the illumination field 312. The ovals 326 represent the portions or zones having different controllable partial coherence or fill geometry. However, it should be appreciated that the changes in partial coherence or fill geometry are substantially continuous along the longitudinal dimension L of the slit illumination field 312 with no discreet boundaries. Accordingly, any horizontal/vertical bias is corrected on the substrate as a function of the longitudinal dimension of the slit illumination field 312. When a diffractive optical element is used with the illumination system, boundaries are particularly absent and a continuous adjustment of partial coherence or fill geometry is achieved. The changes in partial coherence or fill geometry may be created by an optical element comprising micro lenses or diffractive elements. When a micro lens optical element is used, the boundaries between different zones may be more identifiable. Therefore, a diffractive optical element is preferred.

Generally, the illumination property modified is the angle or shape of the emerging cone of light or electromagnetic radiation emitted from the respective optical element. Accordingly, the partial coherence or fill geometry of the illuminati-on is locally modified. Therefore, the present invention spatially controls the partial coherence or fill geometry of the illumination. In a plurality of micro lenses that form an optical element or the illumination array, they may have different sizes dependent on position. This effectively changes the cone of illumination emerging from each of the different local optical elements locally or spatially varying the emerging illumination system partial coherence or fill geometry or cone of illumination. This will vary the radiant intensity distribution of the electromagnetic radiation used to illuminate the reticle and thus change the projection optic's response in the direction required to improve performance. These changes in illumination property may be utilized to vary the line width at local regions or sections. The various required changes in illumination properties to achieve or effect line width variations are easily ascertainable to those skilled in the art or may be determined without undue experimentation. For example, varying the radiant intensity effects exposure, energy or dose which may be utilized to effect line width. Such a relationship is disclosed in U.S. patent application Ser. No. 09/232,756 filed Jan. 15, 1999, entitled "Dose Correction For Along Scan Line Width Variation" in the name of Andrew W. McCullough, which is herein incorporated by reference in its entirety. The invention in this application is an additional way to modify line width. In the present invention, by locally changing the cone of illumination and the angle at which the electromagnetic radiation is incident onto the reticle and projected onto the photosensitive substrate, line width may be better controlled and made more uniform. The illumination properties, and in particular the partial coherence or fill geometry, may be selected to modify the line width in a predetermined way to compensate for any variation in line width caused by the projection optics.

The preferred embodiment of the present invention utilizes a diffractive optical element. The diffractive optical element may deliver any type of illumination distribution, such as those illustrated in FIGS. 9A–D. These diffractive optical elements are utilized to spatially control the cone of illumination or electromagnetic radiation illuminating a reticle. These diffractive optical elements are easily modified, while being made, to deliver a position dependent value of the partial coherence or fill geometry of what illumination type is in use. In another embodiment, optical element 14 is a refractive optic.

Figure 8A:
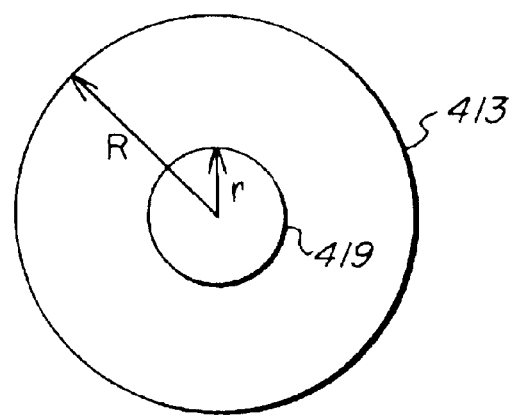
FIG. 8A illustrates partial coherence or fill geometry of an illumination system.
Figure 8B:
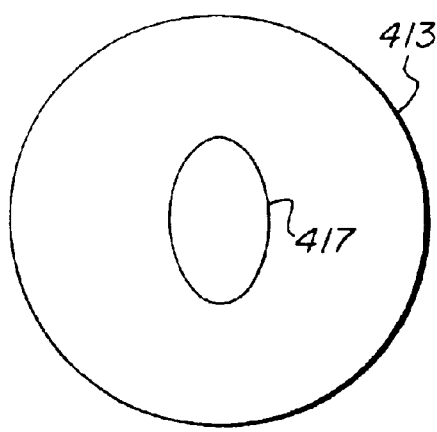
FIG. 8B illustrates a selectively modified partial coherence or fill geometry at a predetermined location.
Figure 8C:
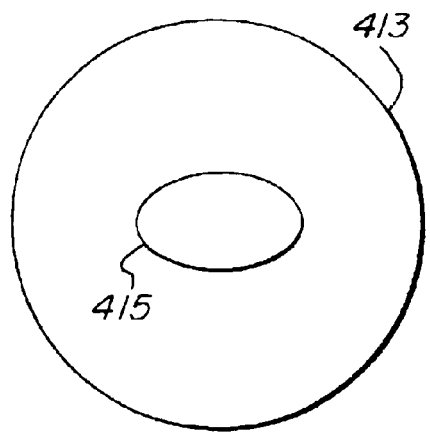
FIG. 8C illustrates a selectively modified partial coherence or fill geometry at another predetermined location.

FIGS. 8A–C graphically illustrates partial coherence or fill geometry of an illumination system and an illumination property that can be modified over predetermined areas or regions with the optical element of the present invention. Referring to FIG. 8A electromagnetic radiation from a source forms an area of illumination 419 having a radius. The area of illumination 419 is often a function of the illumination system and source. The physical aperture or numerical aperture of the projection optics establishes the pupil area 413. Accordingly, this pattern is often referred to as pupil fill. Therefore, the partial coherence or fill geometry may be defined as a fill factor, σ:

$$\sigma = \frac{r}{R}$$

where, r the radius of the area of illumination; and
R the radius of the pupil area.

The present invention results in predetermined modifications to the illumination cone pattern being spatially distributed over predetermined different regions of the illumination field. The predetermined different regions are selected based upon the locations of line width variations resulting in horizontal/vertical bias. The line width variations at a particular location may vary differently in the horizontal or vertical direction. Therefore, the predetermined modifications made to the pattern and resulting illumination properties are made at the particular locations where line width variations are identified and made in a predetermined way to substantially reduce line width variations. The required modifications to the illumination properties needed to effect line width are well know, and typically include modification of the partial coherence or fill geometry or pattern illustrated in FIG. 8A. FIGS. 8B and 8C illustrate different modifications to partial coherence or fill geometry. For example, illustrated in FIG. 8B the area of illumination 417 is elongated. Therefore, the printing of line widths in a region or a location illuminated with the modified partial coherence or fill geometry or pattern illustrated in FIG. 8B will be modified in a predetermined known way, and in particular the horizontal or vertical bias will be affected. Similarly, illustrated in FIG. 8C the area of illumination 415 is elongated in a direction perpendicular to that illustrated in FIG. 8B. Therefore, the printing of line widths in a region or a location illuminated with the modified partial coherence or fill geometry or pattern illustrated in FIG. 8C will be modified in another predetermined way, and in particular the horizontal or vertical bias will be affected. That is, the partial coherence or fill geometry or pattern illustrated in FIG. 8B may affect the line width of vertical lines more than the line width of horizontal lines, and the partial coherence or fill geometry or pattern illustrated in FIG. 8C may affect the line width of horizontal lines more than the line width of vertical lines. The optical element of the present invention therefore provides an efficient and expedient means for modifying illumination properties, and in particular partial coherence or fill geometry, at predetermined regions or locations in an illumination field used to project the image of a reticle onto a photosensitive substrate thereby affecting the horizontal or vertical bias of the processed line width spatially corresponding or matched to the predetermined regions on the optical element.

Figure 9A:
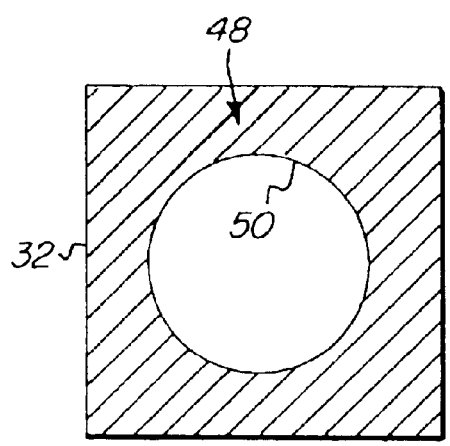
FIGS. 9A–B illustrates different types of illumination.
Figure 9B:
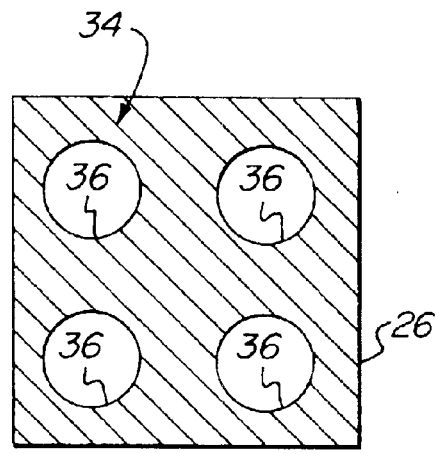
Figure 9C:
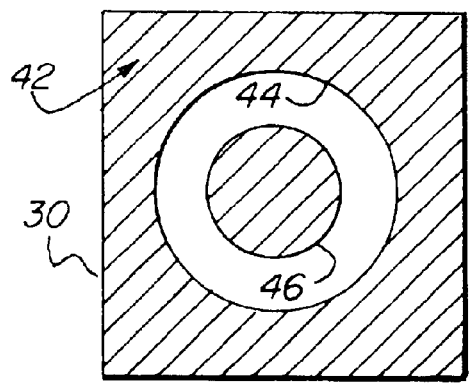
Figure 9D:
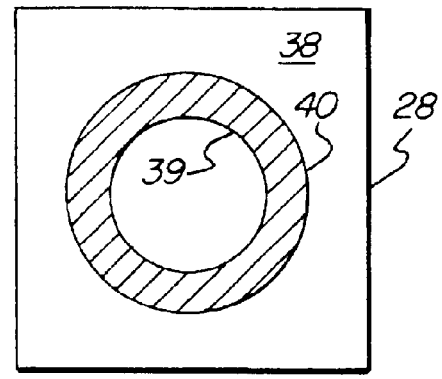

FIGS. 9A–C schematically illustrates different illumination types which may be used in illumination systems. These illumination types 26, 28, 30, and 32 may be formed by filters, micro lens arrays, or preferably by diffractive optical elements. These illumination types may be tailored by known techniques to obtain a desired illumination angular distribution at the reticle. For example, in FIG. 9B illumination region 26 illustrates a quadrupole. A quadrupole illumination is characterized by several circular bright portions 36 located off-axis and surrounded by darker portions 34. Quadrupole illumination may be achieved with pyramidal lenslets formed in a micro lens array. In FIG. 9D, illumination region 28 illustrates an annular illumination region having a bright portion 38 surrounding a dark portion annular ring 40 surrounding a bright circular portion 39. In FIG. 9C, illumination region 30 has a dark portion 42 surrounded by a bright annular portion 44 with a central dark portion 46. The annular illumination patterns illustrated in illumination regions 30 and 28 may be formed by conical lenslets in a micro lens array. In FIG. 9A, illumination region 32 is formed by a dark portion 48 surrounding a bright circular portion 50 forming a top hat. The illumination pattern illustrated in top hat region 32 may be formed by hexagonal close packed parabolic lenslets in a micro lens array. The illumination regions 26, 28, 30, and 32 graphically illustrate several different illumination properties or types that may be desired. The actual optical elements used to produce the illumination properties or types graphically illustrated in FIG. 3 may physically appear quite different.

As illustrated, the different illumination properties, including the cone of radiation, or changes in partial coherence or fill geometry or other illumination properties are locally or spatially modified at different regions according to the present invention. Extensions to other patterns is obvious. Therefore, by locally or spatially modifying the cone of radiation or other illumination properties, at different regions on an optical element the variations in line width resulting from the signature or variances in a photolithographic tool or system can be compensated for reducing line width variance and improving system performance. Additionally, the optical element can be easily replaced should the photolithographic system or tool change in performance over time to maintain imaging quality and system performance.

Once a corrective optical element having different illumination property regions, as described herein, is incorporated into the illumination system of a photolithographic system or tool, the improvements in line width control achieved by the corrective optical element are beneficial to the photolithographic system or tool generally for any reticle utilized. Utilizing the teachings of the present invention in this way is additionally advantageous in that over time, variations in the optics of the projection optic system may be modified or corrected by fabricating different corrective optical elements which may be less expensive and more easily accomplished than changing or re-manufacturing the relatively expensive and complicated projection optics of the photolithographic system. Accordingly, in this embodiment of the present invention, the performance of the photolithographic system is greatly improved and line width bias variances over the entire field substantially reduced resulting in more uniform line widths on the printed substrate. This greatly increases the performance and yield, making possible the manufacture of semiconductor devices having smaller line widths more efficiently and therefore at less cost.

Figure 10:
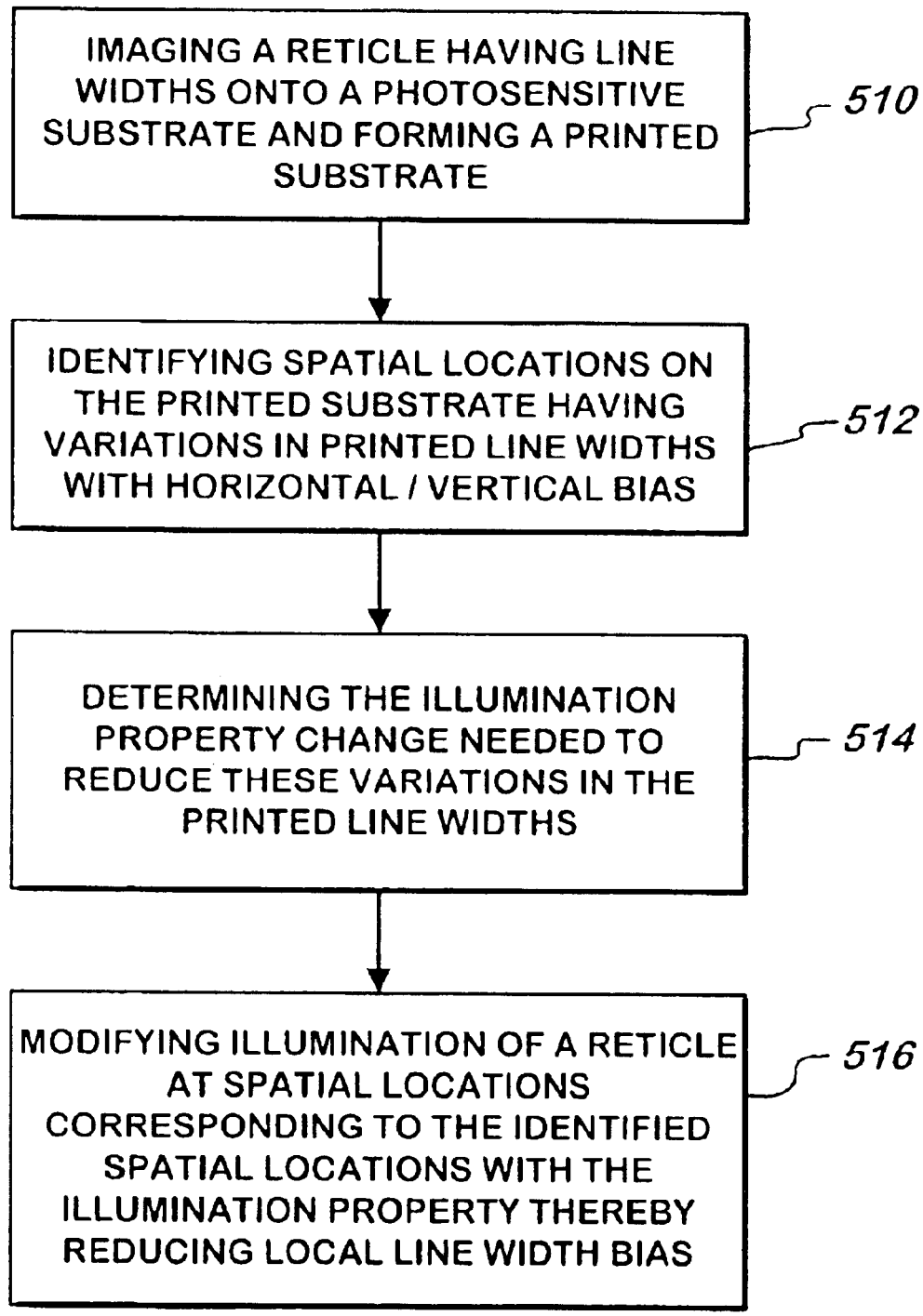
FIG. 10 is a block diagram illustrating the method steps use in practicing the present invention.

FIG. 10 is a block diagram illustrating the method steps for practicing the present invention. Block 510 represents the step of imaging a reticle having line widths onto a photosensitive substrate and forming a printed substrate. This step corresponds to printing a test substrate. Block 512 represents the step of identifying spatial locations on the printed substrate having variations in printed line widths with horizontal/vertical bias. This step corresponds to mapping the locations of the variations in line width caused by whatever source, but usually due to variances in manufacturing tolerances in the projection optics. Block 514 represents the step of determining the illumination property change needed to reduce this variations in the printed line widths. This step corresponds to selecting the required change in the illumination needed to modify the line width compensating for slight imaging imperfections in the projection optics to reduce the printed line width variations. Preferably, this illumination property is the partial coherence or fill geometry. Block 516 represents the step of modifying the illumination of a reticle at the spatial locations corresponding to the identified spatial locations on the printed substrate with the illumination property determined needed to reduce the line width bias. Preferably, the illumination is modified by changing the local partial coherence or fill geometry. The partial coherence or fill geometry is modified by changing the cone of radiation at the identified spatial location. The partial coherence or fill geometry may be modified to selectively affect line width in the horizontal or vertical direction.

Accordingly, the present invention has many practical applications in that different illumination regions can be created on a single optical element used to optimize the exposure of a photosensitive resist covered wafer, greatly augmenting overall system performance and yield. This invention is applicable to both stepping and scanning systems. The major difference is that the modification or tuning of the illumination system is one dimensional in the scanning case and two dimensional in the stepping case.

Figure 11A:
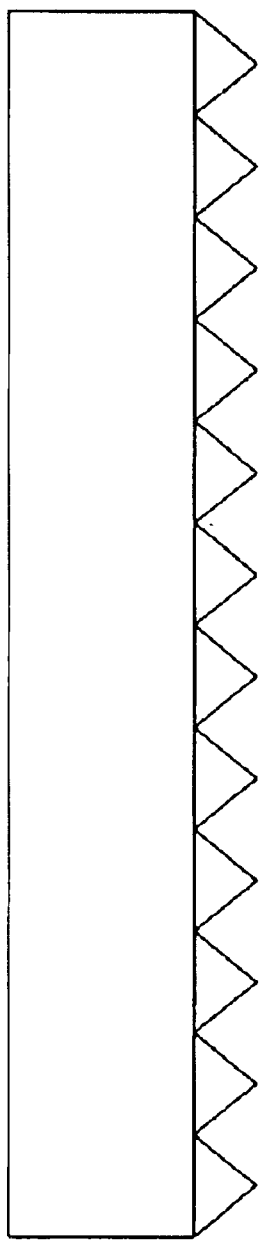
FIG. 11A is an elevational view schematically illustrating a microlens array having conical lenslets.
Figure 11B:
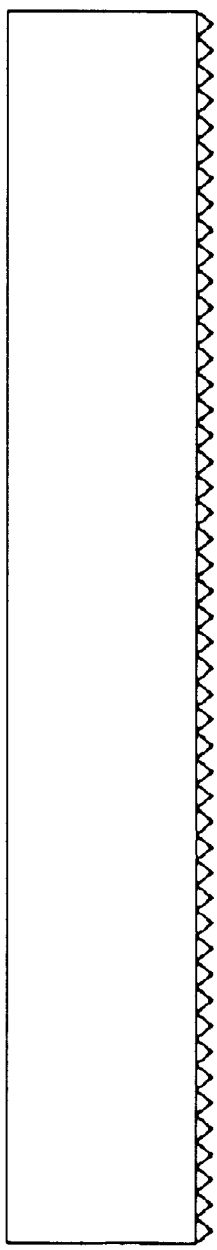
FIG. 11B is an elevational view schematically illustrating a diffraction optical element.
Figure 11C:
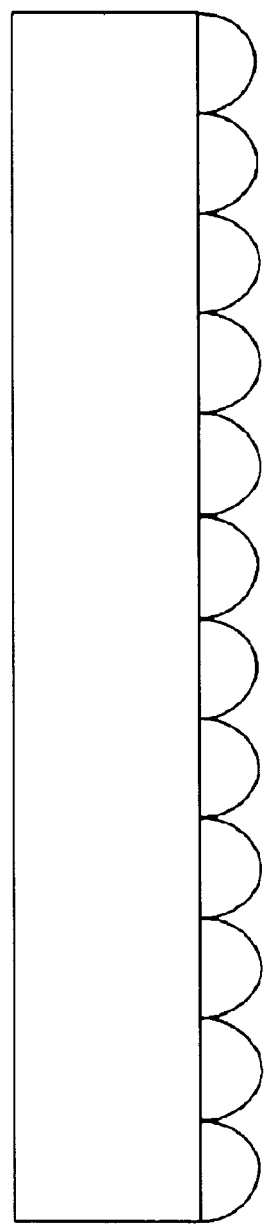
FIG. 11C is an elevational view schematically illustrating a microlens array having parabolic lenslets.
Figure 11D:
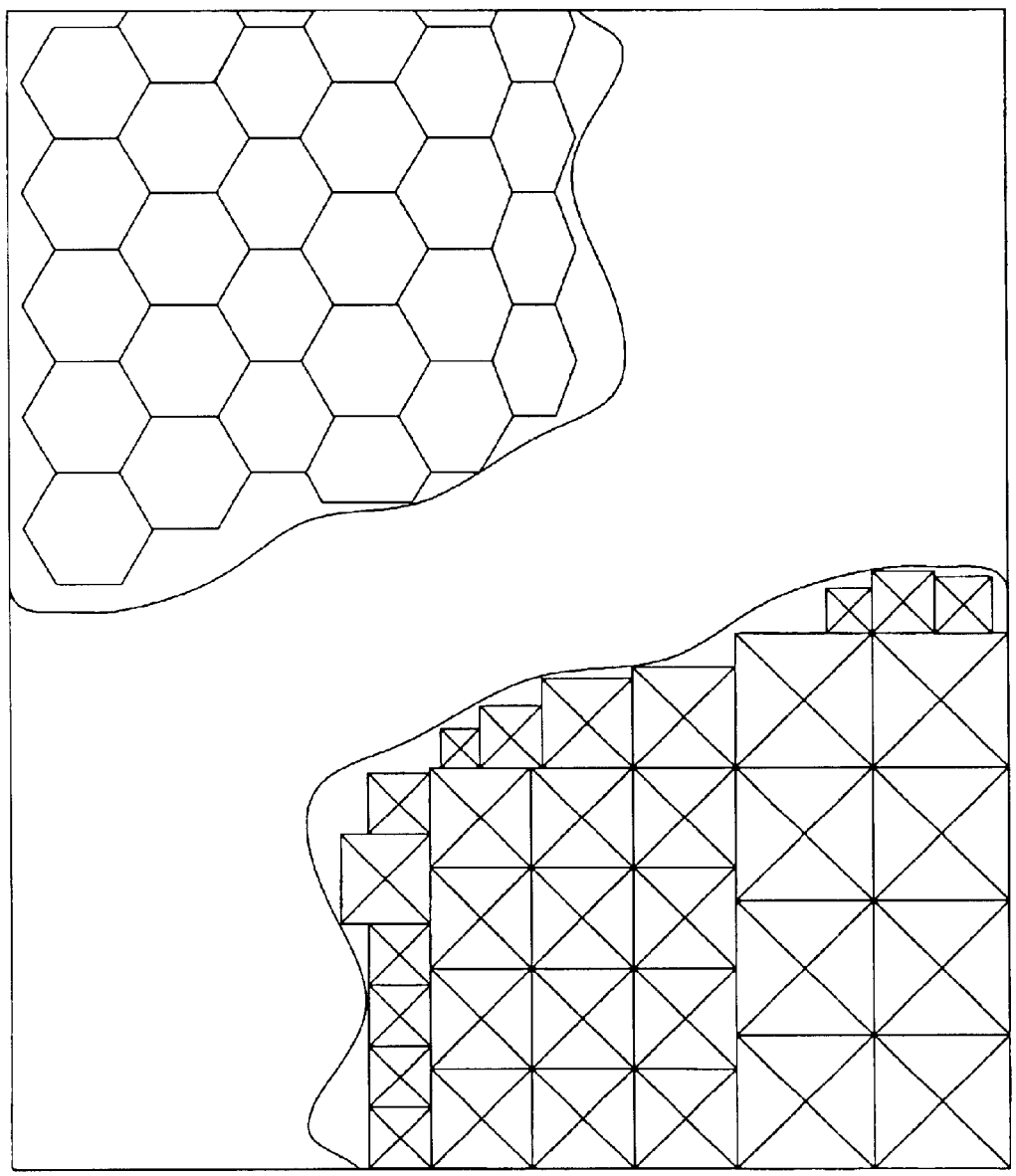
FIG. 11D is a plan view schematically illustrating sectional portions of a microlens array having hexigonal close packed lenslets and pyramidal lenslets.

FIG. 11A is an elevational view schematically illustrating a microlens array having conical lenslets. FIG. 11B is an elevational view schematically illustrating a diffraction optical element. FIG. 11C is an elevational view schematically illustrating a microlens array having parabolic lenslets. FIG. 11D is a plan view schematically illustrating sectional portions of a microlens array having hexigonal close packed lenslets and pyramidal lenslets.

Although the present invention has been illustrated with respect to several embodiments, it should be readily appreciated that those skilled in the art may make various modifications without departing from the spirit and scope of this invention.

What is claimed is:

1. An optical element comprising:
   a plurality of different illumination regions, each of said plurality of different illumination regions having a different illumination property selected to reduce line width variations on a printed substrate,
   whereby line width on the printed substrate is modified over portions of the printed substrate spatially corresponding to said plurality of different illumination regions.

2. An optical element as in claim 1 wherein: said plurality of different illumination regions are formed by a micro lens array.

3. An optical element as in claim 2 wherein:
   the micro lens array comprises hexagonal close packed parabolic lenslets.

4. An optical element as in claim 2 wherein:
   the micro lens array includes conical lenslets.

5. An optical element as in claim 2 wherein:
   the micro lens array includes pyramidal lenslets.

6. An optical element as in claim 1 wherein:
   said plurality of different illumination regions are formed by a diffractive optical element.

7. An optical element as in claim 1 wherein:
   the illumination property comprises partial coherence or fill geometry.

8. An optical element for use in a scanning photolithographic system comprising:
   a plurality of illumination regions positioned longitudinally along the optical element, each of said plurality of different illumination regions having a different illumination property illuminating different portions of a reticle,
   whereby line width of a printed substrate is modified over portions of the printed substrate spatially corresponding to said plurality of different illumination regions.

9. An optical element for use in a scanning photolithographic system as in claim 8 wherein:
   each of said plurality of different illumination regions is formed by a diffractive optical element.

10. An optical element for use in a photolithographic system and positioned between an illumination source and a reticle having horizontal and vertical line widths to be projected onto a photosensitive substrate resulting in printed horizontal and vertical line widths comprising:
    a plurality of regions located at predetermined spatial locations selected for locally affecting the printed line widths; and
    means, placed in each of said plurality of regions, for modifying an illumination property of the illumination source thereby affecting the printed line widths on the photosensitive substrate at the predetermined spatial locations,
    whereby variations in width of the printed line widths at the predetermined spatial locations are reduced.

11. An optical element for use in a photolithographic system as in claim 10 wherein:
    the illumination property comprises partial coherence or fill geometry.

12. An optical element for use in a photolithographic system as in claim 10 wherein:
    the illumination property is a cone of radiation emerging from one side of said optical element.

13. An optical element for use in a photolithographic system as in claim 10 wherein:
    the illumination property affects the printed horizontal line width.

14. An optical element for use in a photolithographic system as in claim 10 wherein:
    the illumination property affects the printed vertical line width.

15. An optical element for use in a photolithographic system as in claim 10 wherein:
    said means is a diffractive optic.

16. An optical element for use in a photolithographic system as in claim 10 wherein:
    said means is a refractive optic.

17. A photolithography system used in projecting an image of a reticle onto a photosensitive substrate comprising:
    an illumination source;
    an optical element, said optical element having a plurality of different illumination regions spatially positioned thereon, each of the plurality of different illumination regions having an optical arrangement producing a different illumination property selected to modify line width of a printed substrate; and
    projection optics, said projection optics projecting electromagnetic illumination from the illumination source onto the photosensitive substrate,
    whereby the plurality of different illumination regions locally modify line width on the printed substrate.

18. A photolithography tool as in claim 17 wherein:
    said optical element is a microlens array.

19. A photolithography tool as in claim 18 wherein:
    the micro lens array comprises hexagonal close packed parabolic lenslets.

20. A photolithography tool as in claim 18 wherein: the micro lens array includes conical lenslets.

21. A photolithography tool as in claim 18 wherein:
    the micro lens array includes pyramidal lenslets.

22. A photolithography tool as in claim 17 wherein:
    said optical element is a diffractive optical element.

23. A photolithography tool as in claim 17 wherein:
    the illumination property comprises partial coherence or fill geometry.

24. A photolithographic system for manufacturing electronic devices comprising:
    illumination means for producing electromagnetic radiation; diffractive optical element means, positioned to receive the electromagnetic radiation, for providing a plurality of different illumination regions each having a predetermined partial coherence or fill geometry; and
    projection optic means, positioned to receive the electromagnetic radiation passing through a reticle, for projecting an image of the reticle onto the photosensitive substrate,
    whereby the exposure of the photosensitive substrate at locations corresponding to the plurality of different illumination regions is modified affecting line width.

25. A scanning photolithographic system used in projecting an image of a reticle onto a photosensitive substrate comprising:
    an illumination source providing a rectangular illumination field having a longitudinal dimension, said illumination source illuminating a portion of the reticle;

projection optics having a signature introducing vertical/horizontal bias to line widths on a printed photosensitive substrate; and a diffractive optical element positioned between said illumination source and the reticle, said diffractive optical element having a plurality of continuous zones positioned to provide illumination having a predetermined locally changing partial coherence or fill geometry along the longitudinal dimension of the rectangular illumination field used in projecting the image of the reticle onto the photosensitive substrate so as to compensate for the vertical/horizontal bias introduced by said projection optics.

26. A method of modifying printed line widths on a processed photosensitive substrate used in a photolithographic system for projecting the image of a reticle having line widths onto a photosensitive substrate comprising the steps of:

identifying spatial locations on a printed photosensitive substrate having variations in printed line widths; and modifying an illumination property of an illumination source used to illuminate the reticle at spatial locations on the reticle corresponding to the spatial locations identified in said step of identifying spatial locations on a printed photosensitive substrate having variations in printed line width, whereby local modifications to line width may be made reducing local line width variations.

27. A method of modifying printed line widths on a processed photosensitive substrate used in a photolithographic system as in claim 26 wherein:

said step of modifying an illumination property comprises placing an optical element having different illumination regions between the illumination source and the reticle.

28. A method of modifying printed line widths on a processed photosensitive substrate used in a photolithographic system as in claim 26 wherein:

the illumination property is partial coherence or fill geometry.

29. A method of modifying printed line widths on a processed photosensitive substrate used in a photolithographic system as in claim 26 wherein:

the illumination property affects the printed line widths oriented in a single direction only.

30. A method of exposing a photosensitive substrate in a scanning photolithographic system comprising the steps of:

forming a rectangular illumination field having a longitudinal dimension;

identifying locations on a photosensitive substrate having horizontal/vertical bias introduced by projection optics;

determining required changes in cones of illumination in the longitudinal dimension of the rectangular illumination field needed to compensate for the horizontal/vertical bias introduced by the projection optic to accurately reproduce the image of a reticle being printed;

modifying the cones of illumination in the illumination field along the longitudinal dimension with an optical element according to the required changes; and scanning the rectangular illumination field across the reticle, whereby horizontal/vertical bias introduced by the projection optics is substantially corrected improving imaging performance of the photolithographic system.

31. A method of exposing a photosensitive substrate as in claim 30 wherein:

the optical element is a diffractive optical element.

* * * * *

UNITED STATES PATENT AND TRADEMARK OFFICE
CERTIFICATE OF CORRECTION

PATENT NO. : 6,822,728 B2  
DATED : November 23, 2004  
INVENTOR(S) : McCullough et al.

It is certified that error appears in the above-identified patent and that said Letters Patent is hereby corrected as shown below:

Title page,
Item [*] Notice, please insert -- This patent is subject to a terminal disclaimer. --.

Signed and Sealed this

Thirtieth Day of August, 2005

JON W. DUDAS
*Director of the United States Patent and Trademark Office*